United States Patent
Perry

(10) Patent No.: US 7,656,151 B2
(45) Date of Patent: Feb. 2, 2010

(54) PRINTED CIRCUIT BOARD WITH AN OPENING TO ACCESS COMPONENTS ATTACHED TO THE PRINTED CIRCUIT BOARD

(75) Inventor: Richard S Perry, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 102 days.

(21) Appl. No.: 11/857,320

(22) Filed: Sep. 18, 2007

(65) Prior Publication Data

US 2008/0007286 A1 Jan. 10, 2008

Related U.S. Application Data

(62) Division of application No. 10/612,712, filed on Jun. 30, 2003, now Pat. No. 7,276,921.

(51) Int. Cl.
*G01R 31/28* (2006.01)
(52) U.S. Cl. .................................. 324/158.1
(58) Field of Classification Search ............... None
See application file for complete search history.

(56) References Cited

U.S. PATENT DOCUMENTS

| | | | |
|---|---|---|---|
| 4,138,643 A | 2/1979 | Beck et al. | |
| 4,658,327 A * | 4/1987 | Hernandez | 361/306.2 |
| 4,740,746 A | 4/1988 | Pollock et al. | |
| 4,871,964 A | 10/1989 | Boll et al. | |
| 4,912,400 A | 3/1990 | Plante | |
| 5,283,518 A | 2/1994 | King et al. | |
| 5,488,313 A | 1/1996 | Gourse et al. | |
| 5,565,788 A | 10/1996 | Burr et al. | |
| 5,952,839 A | 9/1999 | Fredrickson | |
| 6,281,690 B1 | 8/2001 | Frey | |
| 6,329,960 B1 * | 12/2001 | Andrew et al. | 343/846 |
| 6,538,461 B2 | 3/2003 | Novak et al. | |
| 6,711,814 B2 * | 3/2004 | Barr et al. | 29/852 |
| 6,717,425 B2 | 4/2004 | McClure et al. | |
| 6,731,117 B1 | 5/2004 | Slough | |
| 6,803,527 B2 * | 10/2004 | Dishongh et al. | 174/262 |
| 2002/0186002 A1 | 12/2002 | McAllister et al. | |
| 2003/0213619 A1 * | 11/2003 | Denzene et al. | 174/261 |
| 2003/0218463 A1 | 11/2003 | Stierman et al. | |
| 2004/0263189 A1 | 12/2004 | Perry | |

* cited by examiner

*Primary Examiner*—Vinh P Nguyen
(74) *Attorney, Agent, or Firm*—Schwegman, Lundberg & Woessner, P.A.

(57) ABSTRACT

An electronic package includes a printed circuit board having a primary side, and a secondary side. A component, having a main body, is attached to the primary side of the printed circuit board. A pad is attached to the main body of the component. The printed circuit board has an opening therein positioned near the pad.

9 Claims, 5 Drawing Sheets

PRINTED CIRCUIT BOARD WITH AN OPENING TO ACCESS COMPONENTS ATTACHED TO THE PRINTED CIRCUIT BOARD

RELATED APPLICATION

This application is a Divisional of U.S. Ser. No. 10/612,712, filed Jun. 30, 2003, now U.S. Pat. No. 7,276,921, which is incorporated herein by reference.

FIELD OF THE INVENTION

The present invention relates to a method and apparatus for probing components on printed circuit boards. More specifically, the present invention relates to probing the underside of a component through an opening in a printed circuit board ("PCB")

BACKGROUND OF THE INVENTION

There has been a sharp increase in the number of printed circuit boards ("PCBs") populated with radio frequency ("RF") components during the past several years as a result of the increased popularity of wireless networks. Wireless networks allow computers to be coupled to a network using RF signals or an RF link. In a particular network, there may be one or more computers that use encrypted RF signals to communicate with the network. In some networks all the computers may be attached by way of RF links.

A computer needs a network card in order to be connected to a network with a number of other computers. A network card is a PCB having the electronics necessary for interfacing with a switch associated with a network of computers. The network cards that connect a computer to a network using an RF link, also includes RE components, such as an antennae. Like any other product, it is desirable to electrically test a printed circuit board that includes an RF component such as an antennae. Generally, it is desirable to test each of the wireless network cards rather than to test a sample of the manufactured network cards so that consumers can be assured that the wireless network cards work.

In the past, several apparatuses have been used to make electrical testing connections RF antennae components. Previous test contactors have limitations for high performance devices and for reliable operation when used with high volume, automated device handling equipment. The previously used contactors have a relatively short life in that only a certain number of connections can be reliably made to the RF component. In addition, some contactors have to be attached to the RF components from the primary side of the printed circuit board. Many of the other components of the circuit board are tested from the secondary or bottom side of the circuit board. As a result, two testing sequences may have to be run in certain processes to fully test the device under test. In addition, previous contactors may not provide for a fully shielded connection between the PCB and the RF component. As a result, noise or interference could compromise the testing of the device under test.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

DETAILED DESCRIPTION OF THE INVENTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the fall ambit of the claims and all available equivalents. The following description is, therefore, not to be taken in a limited sense, and the scope of the present invention is defined by the appended claims.

Figure 1:
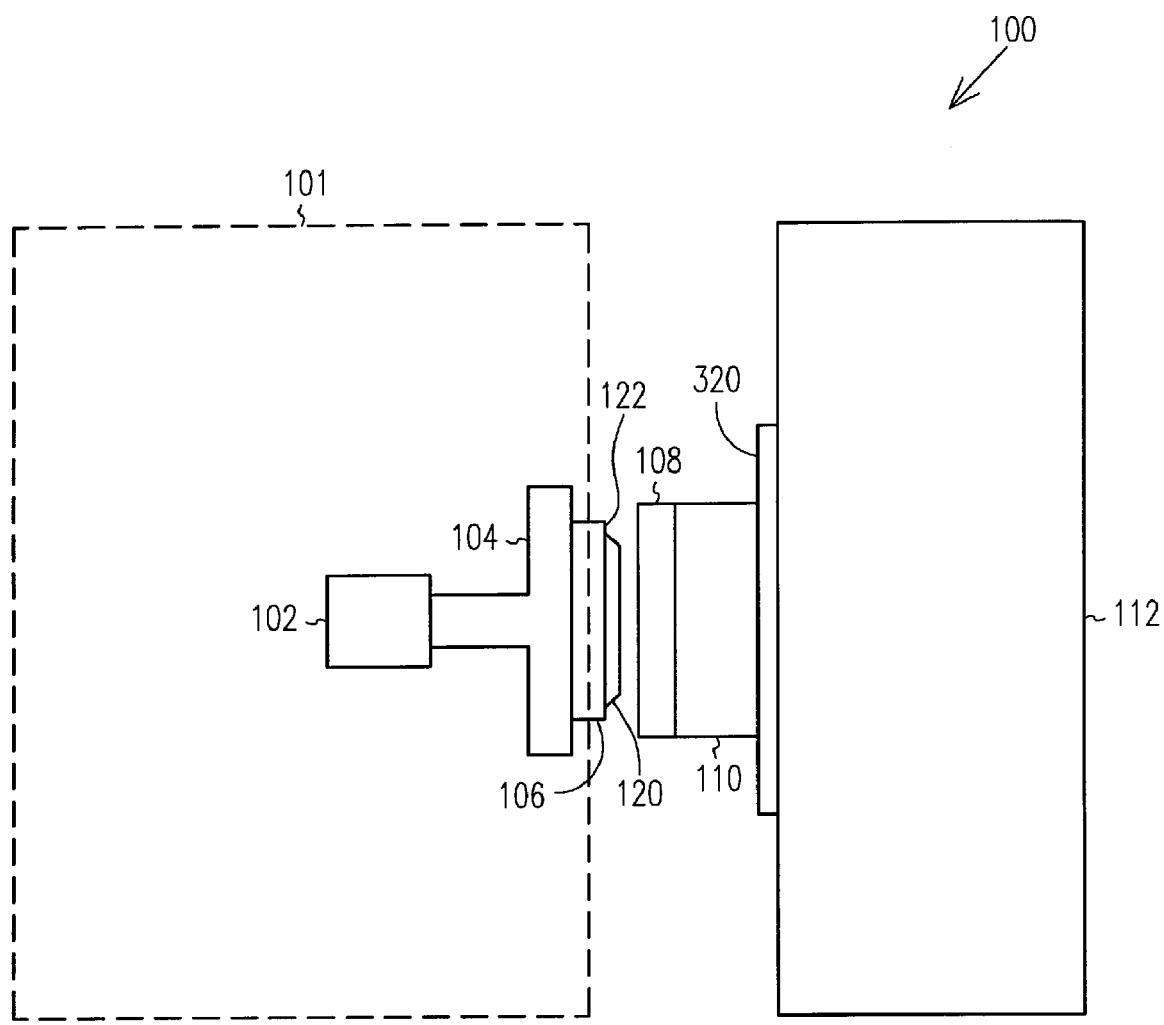
FIG. 1 is a schematic diagram of an electrical testing apparatus, according to an embodiment of this invention.

FIG. 1 is a schematic diagram of the testing apparatus. The testing apparatus 100 includes an automated test handler 101. The automated test handler includes an actuator 102, a plunger 104, and a nest 106. The testing apparatus includes a contactor fixture 110 having a guide plate 108, an interface board 320 and automatic test equipment or test electronics 112. The nest 106 holds an electrical component under test. The electrical component is not shown in FIG. 1. The plunger 104 typically holds the electrical component within the nest 106 via vacuum pickup. The nest may include beveled surfaces, such as bevel 120, which is used to coarsely align the nest with the guide plate 108. The nest also includes some hard stops 122 which abut the edge of the guide plate 108 and limit the travel of nest 106 into the guide plate 108 of the contactor fixture 110. When the nest 106 is holding the electrical component to be tested, the plunger 104 is moved by actuator 102 so that the electrical component is moved toward the guide plate 108. The guide plate provides both coarse alignment as well as fine alignment as the nest 106 enters the guide plate 108. The contactor fixture 110 includes contacts to the electrical paths and to the electronics 112 for testing the electrical component. The contactor fixture 110 also includes specific test devices such as described in FIGS. 2-4. The electronics for testing the component are also called test electronics.

Figure 2:
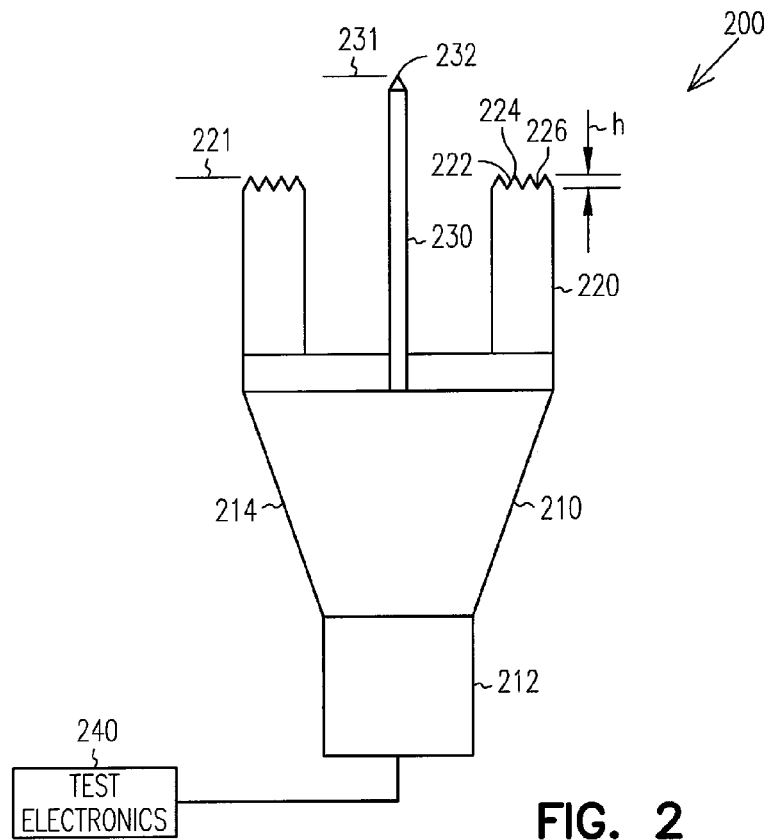
FIG. 2 is a schematic side view of a test device, according to an embodiment of this invention.
Figure 3:
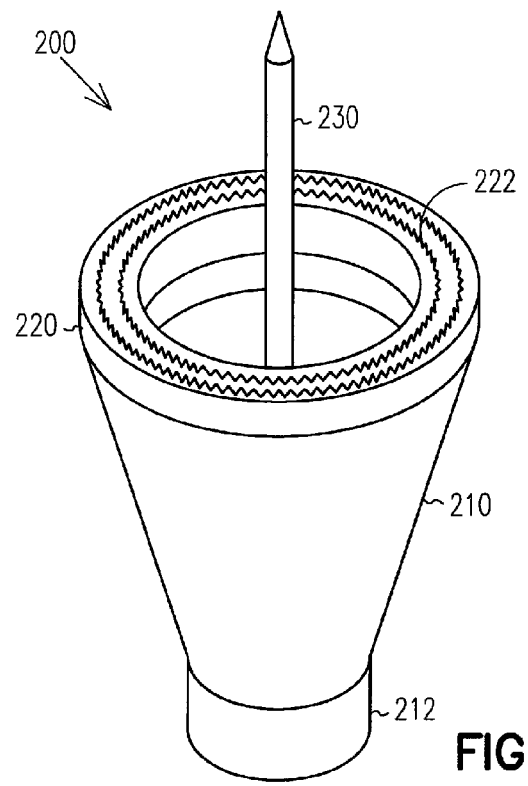
FIG. 3 is a perspective view of the test device, according to an embodiment of this invention.

FIG. 2 is a schematic side view of a test device 200, according to an embodiment of this invention. FIG. 3 is a perspective view of the test device 200. Now with reference to both FIGS. 2 and 3, the details of the test device 200 will be discussed. The test device has a housing 210 which encloses an annular base 220 at one end and an annular element 212 at the other end of the test device. The housing 210 has an intermediate portion 214, which is frusto-conically shaped, since the annular base 220 has a diameter which is larger than the diameter of the annular element 212. The annular base 220 includes a contact surface 222. The contact surface 222 includes a plurality of peaks 224 and valleys 226. The difference in height between the top of the peaks 224 and the valleys 226 is designated by the dimension h, shown in FIG. 2. The top of the peaks 224 are sharpened so that they break an oxide layer on any conductive metal that the contact surface 222 engages. By breaking the oxide layer, the sharpened peaks 224 ensure that good electrical contact is made between the contact surface 222 and the surface which the contact surface 222 contacts. The test device 200 also includes an elongated probe 230. The probe 230 includes a probe tip 232. The probe tip 232 is also sufficiently sharp so that it penetrates slightly any surface which it contacts. The peaks 224 of the contact surface 222 generally terminate at a first plane. The first plane is designated by the reference numeral 221. The probe tip 232 terminates at a second plane, designated by the reference numeral 231 in FIG. 2. Thus, the test device 200 includes an element having a contact surface 222 for contacting surfaces in a first plane 221 and as a probe 230 having a probe tip or free end 232 for contacting surfaces in a second plane 231.

A test device 200 includes an element 220 having a surface 222 for contacting a first plane 221, and a probe 230 having a free end or tip 232 positioned in a second plane 231. The element 220 of the test device 200 having the surface 222 to contact the first plane 221 includes features 224 for contacting a ground plane. In some embodiments, the length of the probe 230 in the test device 200 is greater than the length of the element 220 having a surface 222 for contacting the first plane 221. The element 220 of the test device 200 shields the probe 230. In some embodiments, the element 220 surrounds the probe 230 to shield the probe 230. The element 220 that shields the probe 230 also includes features 224 for contacting a ground plane. The features 224 are dimensioned to prevent interference from radio signals of a selected frequency. In one embodiment, the features 224 for contacting a ground plane include a plurality of pointed peaks 224 separated by valleys 226 wherein the height, h, of the peaks 224 are dimensioned to prevent passage of radio signals of a selected frequency. In some embodiments, the element 220 includes a cylindrical portion that surrounds a portion of the probe 230.

The test device 200 also includes test electronics 240, which are electrically connected to the probe 230 and the contact surface 222. The test electronics 240 produce a series of signals used to test electrical components.

Figure 4:
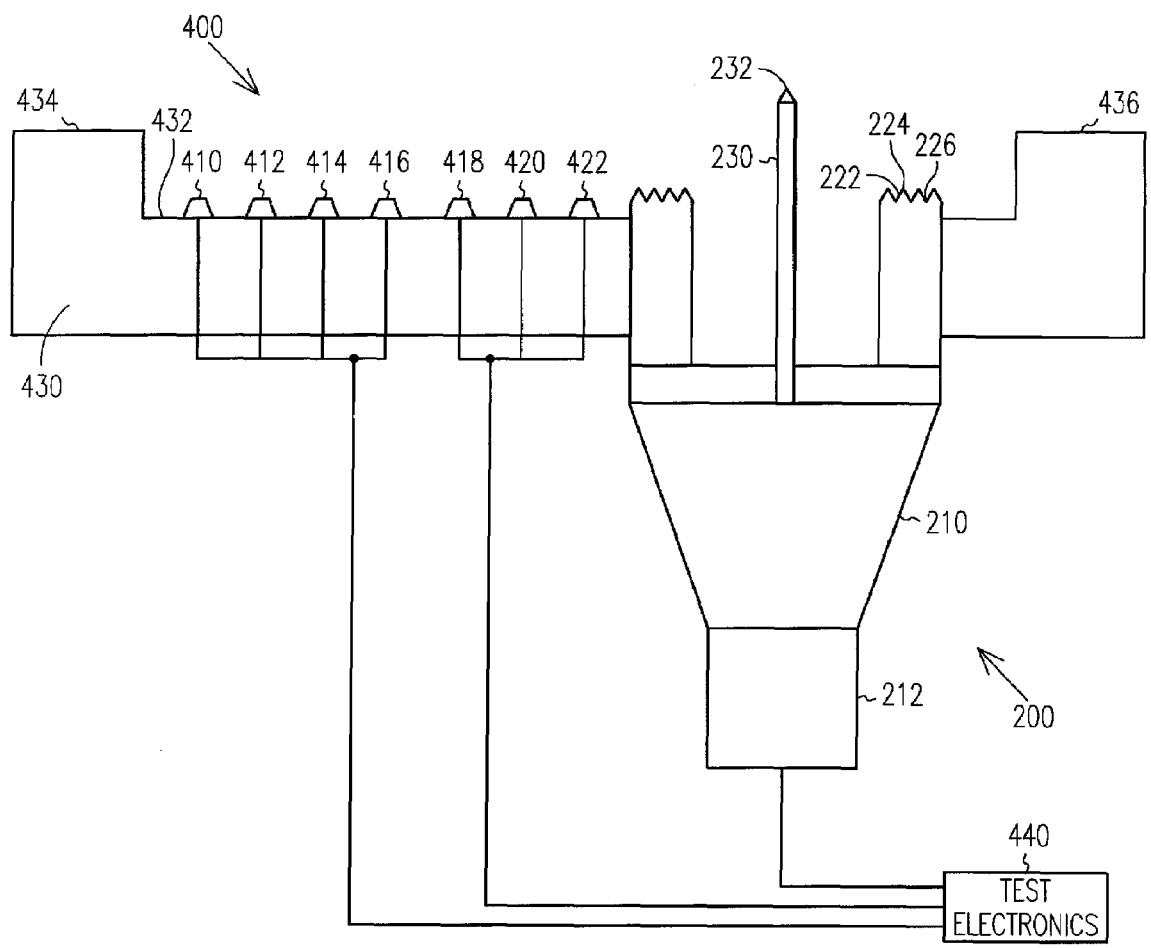
FIG. 4 is a schematic side view of a fixture that includes the test device and other contactors, according to an embodiment of this invention.

FIG. 4 is a schematic side view of a fixture 400 that includes the test device 200 and other contactors, according to an embodiment of this invention. The fixture 400 includes the test device 200. More specifically, the fixture 400 includes the contact surface 222 having peaks 224 and valleys 226 of a selected height, h (as shown in FIG. 2), and a probe 230. As shown in FIG. 4, the fixture 400 also includes the housing 210 and the annular element 212 of the test device 200. It should be noted that in some embodiments of the invention, the housing 210 and the annular element 212 may be modified or eliminated. The fixture 400 also includes a contactor 410, a contactor 412, a contactor 414, a contactor 416, a contactor 418, a contactor 420, and a contactor 422. The contactors 410, 412, 414, 416, 418, 420, and 422 have surfaces which are essentially coplanar with the peaks 224 of the contact surface 222. The fixture 400 includes a main body 430. The main body 430 includes a nested surface 432. In other words, the nested surface 432 is bounded by a set of sidewalls including a sidewall 434, and a sidewall 436. The electrical contactors 410, 412, 414, 416, 418, 420, and 422 are located or positioned on the nesting surface 432 of the fixture 400. The contactors 410, 412, 414, 416, 418, 420, and 422 are electrically connected to a set of test electronics 440. The testing device 200 is also electrically connected to the test electronics 440. As shown in FIG. 4, contactors 410, 412, 414, and 416 form a first group of contact which are electrically connected to the test electronics 440. The contactors 418, 420, 422 are a second group of contacts which are electrically connected to the test electronics 440. It should be noted that the contacts 410, 412, 414, 416, 418, 420 and 422 need not be grouped and that each individual contact may have their own electrical path to the test electronics 440. It should be further noted that the test electronics 440 could be incorporated within the main body 430 of the fixture 400. Furthermore, the nested surface 432 and the sidewalls 434, 436 that partially bound the nested surface 432 can be provided with datums and guides which enable a device under test to be precisely positioned with respect to the nested surface 432 of the fixture 400. In addition, the fixture 400 can have a different orientation. As shown here, the contacts 410, 412, 414, 416, 418, 420, 422 and the contact surface 222 and the probe 230 are oriented so that all the contact elements and the elements of the test device 200 are substantially upwardly oriented. In this case, a device under test would be lowered to the nested surface 432. The nested surface 432 and the fixture 400 could also be moved to meet a surface of the device under test. Another orientation might be that the nested surface 432, and specifically the contacts 410, 412, 414, 416, 418, 420, and 422, as well as the probe 230 and the contact surface 222 could be oriented in a downward position. The orientation is not limited to these two discussed. The invention contemplates all orientations of the contactors and the test device. It should also be noted that the probe 230, and specifically the tip or free end 231 of the probe 230, is in another plane than the plane associated with the contact surface 222 and the contactors 410, 412, 414, 416, 418, 420, and 422.

Figure 5:
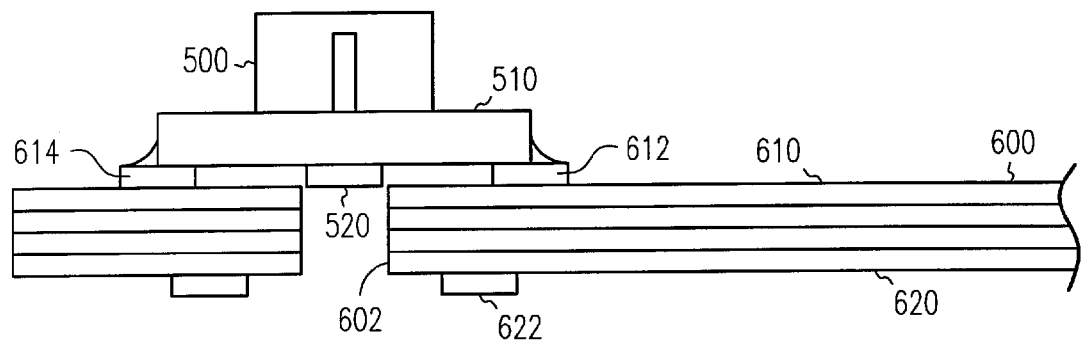
FIG. 5 is a schematic side view of a printed circuit board having a component attached, according to another embodiment of this invention.

FIG. 5 is a schematic side view of a printed circuit board 600 having a component 500 attached, according to an embodiment of this invention. The printed circuit board includes a primary surface 610 and a secondary surface 620. The primary surface 610 is the side to which electrical components, such as component 500, are attached. The primary surface 610 may be considered the top surface of the printed circuit board 600. The secondary surface 620 may be termed the backside of the printed circuit board 600. The printed circuit board 600 also includes an opening 602. The opening 602 passes through the printed circuit board 600 from the secondary surface 620 of the circuit board 600 through to the primary surface 610 of the circuit board 600.

Figure 6:
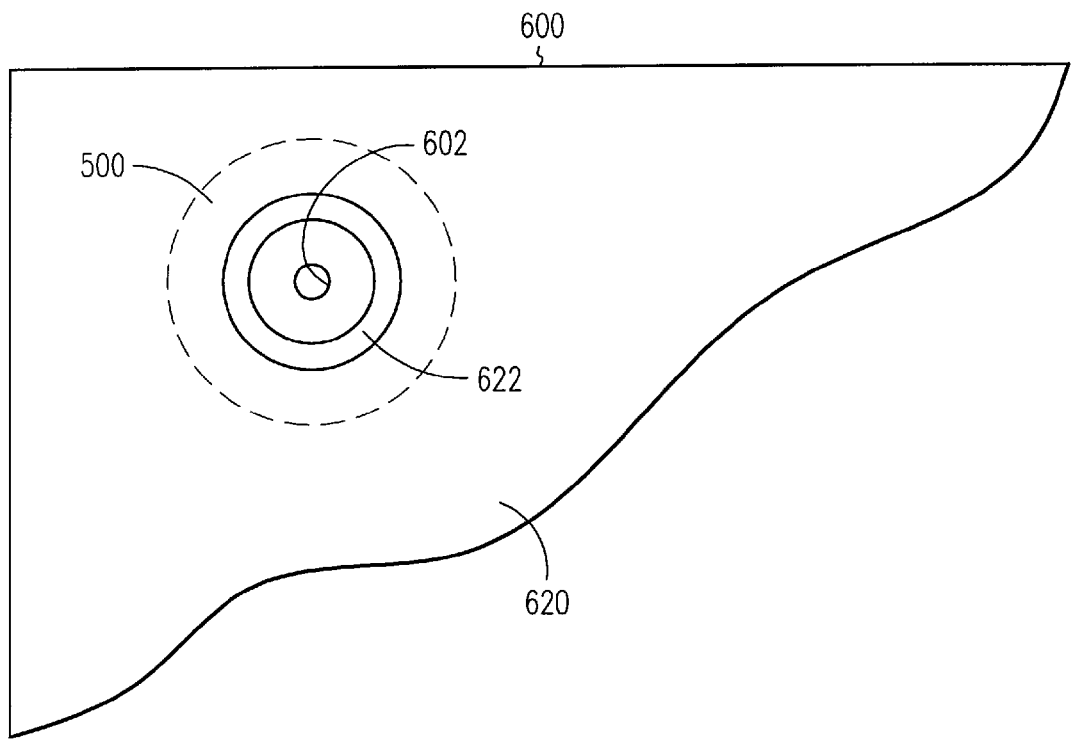
FIG. 6 is a bottom view of a printed circuit board and attached component, according to an embodiment of this invention.

FIG. 6 is a bottom view of the printed circuit board 600 which shows the attached component 500 in phantom, according to an embodiment of this invention. Now referring to both FIGS. 5 and 6, the printed circuit board 600 and the attached component 500 will be further detailed. An annular ring contact 622 is positioned around the opening 602 in the circuit board 600. The annular ring contact 622 is attached to or connected to the secondary surface 620 of the printed circuit board 600. The annular ring contact 622 is connected to a ground plane associated with the printed circuit board 600. The printed circuit board 600 also includes pads 612 and 614 to which the electrical component 500 is attached. The electrical component 500 is an antenna. An antenna is a structure or device for collecting or radiating electromagnetic waves. An antenna may also be thought of as a specialized transducer for converting radio frequency fields into alternating current or converting alternating current into a radio frequency field. The antenna component has a main body 510. Attached to the main body is a pad 520. The pad is situated between the main body 510 and the primary surface 610 of the printed circuit board 600. The opening 602 within the circuit board 600 allows access to the pad 520 of the antenna component 500. Thus, the opening 602 is positioned between the pads 612, 614 to which the component 500 is attached and is positioned to correspond to and allow access to the pad 520 positioned near the primary surface 610 of the printed circuit board.

An electronic package includes a printed circuit board 600 having a primary side 610, and a secondary side 620. The electronic package also includes a component 500 having a main body 510. The main body 510 of the component 500 is attached to the primary side 610 of the printed circuit board 600. The component 500 also has a pad 520 attached to the main body 510 of the component 500. The pad 520 is positioned between the main body 510 of the component 500 and the primary side 610 of the printed circuit board 600. A ground plane connection surface 622 is attached to the secondary side 620 of the printed circuit board 600. The printed circuit board 600 has an opening 602 therein positioned near the pad 520 attached to the main body 510 of the component 500. In some embodiments, the opening 602 passes through the printed circuit board 600 from the primary side 610 to the secondary side 620. The ground plane connection surface 622 circumscribes the opening 602 in the printed circuit board 600. The pad 520 on the main body 510 of the component 500 is in a different plane than the secondary side 620 of the printed circuit board 600. In one embodiment of the invention, the component 500 is a radio antennae or a portion thereof. The pad 520 positioned on the main body 510 of the component 500 is for electrically testing the component 500.

Figure 7:
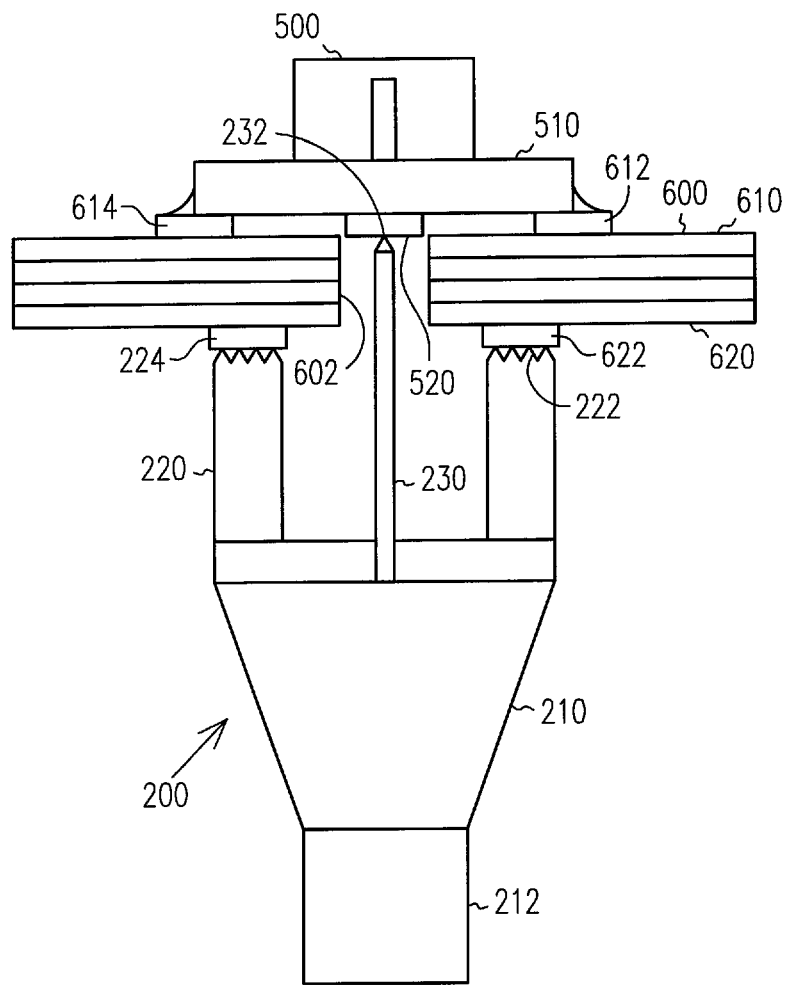
FIG. 7 is a schematic side view of a testing device interacting with a printed circuit board having a component attached, according to an embodiment of this invention.

FIG. 7 is a schematic side view of a testing device 200 interacting with a printed circuit board 600 having a component 500 attached thereto, according to an embodiment of this invention. In operation, the test device 200 is brought into contact with the device under test which is the printed circuit board 600 with the attached antenna component 500. The contact surface 222, and specifically the peaks 224 of the contact surface 222, contact the annular ring contact surface 622 on the secondary side 620 of the printed circuit board 600. The peaks 224 are sufficiently sharp so that an adequate electrical contact to the ground plane is made. The annular ring contact surface 622 is also sufficiently large to further ensure that good contact is made to the ground plane through the contact 622. As the contact surface 222 contacts the annular grounding contact 622, the probe 230, and specifically the tip of the probe 232, contacts the pad 520 attached to the main body 510 of the RF electrical component 500. The probe 230 passes through the opening 602 and the printed circuit board 600 to contact the pad 520 of the electrical component 500. Once the contacts with the electrical pad 520 and the annular grounding contact 622 are made, the test electronics 240 or 440 are then enabled to test the electrical component 500 and any other electrical components which may be associated with the printed circuit board 600.

Figure 8:
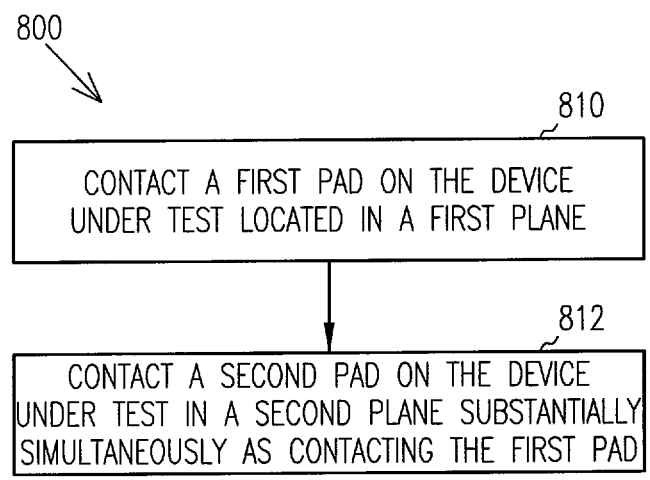
FIG. 8 is a flow chart of another method for testing a device under test, according to an embodiment of this invention.

FIG. 8 is a flow chart of another method for testing a device under test 800, according to an embodiment of the invention. The method for testing a device under test 800 includes contacting a first pad on the device under test located in a first plane 810, and contacting a second pad on the device under test in a second plane 812 substantially simultaneously as contacting the first pad. The first pad and the second pad are contacted from the same side of the device under test 800. In some embodiments, the pad 520 is accessed from the secondary side 620 of a printed circuit board 600. In other embodiments, the pad 520 is accessed from the primary side 610 of the printed circuit board 600. Contacting the second pad of the device under test further comprises passing a probe 230 through a portion of a device under test. In some embodiments, the device under test is a printed circuit board 600 having an electrical component 500 attached to a primary side 610 of the printed circuit board 600. Passing a probe 230 through a portion of the device under test includes passing the probe 230 through an opening 602 in the printed circuit board 600.

An electrical testing device includes a first test probe adapted to contact electrical elements in a first plane, and a second test probe. The second test probe includes an element having a surface for contacting a first plane, and a probe having a free end positioned in a second plane. The electrical testing device further includes a fixture 400 having a nest 432 adapted to receive an electrical device under test having elements to be tested on a first plane and on a second plane. In some embodiments, the electrical device is a printed circuit board 600.

In the previous detailed description of exemplary embodiments of the invention, reference was made to the accompanying drawings, which form a part hereof, and in which is shown by way of illustration specific exemplary embodiments in which the invention may be practiced. These embodiments are described in sufficient detail to enable those skilled in the art to practice the invention, but other embodiments may be utilized and logical, mechanical, electrical, and other changes may be made without departing from the scope of the present invention. Different instances of the word "embodiment" as used within this specification do not necessarily refer to the same embodiment, but they may. The previous detailed description is, therefore, not to be taken in a limiting sense, and the scope of the present invention is defined only by the appended claims.

In the previous description, numerous specific details were set forth to provide a thorough understanding of the invention. However, it is understood that the invention may be practiced without these specific details. In other instances, well-known circuits, structures, and techniques have not been shown in detail in order not to obscure the invention.

Although specific embodiments have been illustrated and described herein, those of ordinary skill in the art will appreciate that any arrangement calculated to achieve the same purpose can be substituted for the specific embodiments shown. This disclosure is intended to cover any and all adaptations or variations of various embodiments of the invention. It is to be understood that the above description has been made in an illustrative fashion, and not a restrictive one. Combinations of the above embodiments, and other embodiments not specifically described herein will be apparent to those of skill in the art upon reviewing the above description. The scope of various embodiments of the invention includes any other applications in which the above structures and methods are used. Therefore, the scope of various embodiments of the invention should be determined with reference to the appended claims, along with the full range of equivalents to which such claims are entitled.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Description of Embodiments of the Invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Description of Embodiments of the Invention, with each claim standing on its own as a separate preferred embodiment.

The invention claimed is:

1. An electronic package comprising:
    a printed circuit board further including:
        a primary side; and
        a secondary side;
    a component having a main body, the component attached to the primary side of the printed circuit board and further including a pad attached to the main body of the component, the pad positioned between the main body of the component and the primary side of the printed circuit board; and
    a ground plane connection surface attached to the secondary side of the printed circuit board, the printed circuit board having an opening therein positioned near the pad attached to the main body of the component, wherein the component is a portion of a radio antenna.

2. The electronic package of claim 1 wherein the opening passes through the printed circuit board from the primary side to the secondary side.

3. The electronic package of claim 1 wherein the ground plane connection surface circumscribes the opening in the printed circuit board.

4. The electronic package of claim 1 wherein the pad on the main body of the component is in a first plane different from a second plane in the secondary side of the printed circuit board.

5. The electronic package of claim 1 wherein the pad positioned on the main body of the component is configured to allow access to the component from the secondary side through the opening.

6. An electronic package comprising:
    a printed circuit board including a primary side, a secondary side, and a connection attached to the secondary side; and
    a component attached to the primary side, the component including a main body and a pad attached to the main body, the pad positioned between the main body and the primary side, wherein the pad of the component is not directly attached to the primary side, and the printed circuit board includes an opening positioned near the pad of the component, and wherein the component is a portion of a radio antenna.

7. The electronic package of claim 6, wherein the pad of the component is electrically unconnected to the connection.

8. The electronic package of claim 7, wherein the printed circuit board includes at least one pad directly attached to the primary side and the component.

9. The electronic package of claim 8, wherein the connection of the printed circuit board is a ground connection.

* * * * *